United States Patent
Kim

(10) Patent No.: US 9,530,693 B2
(45) Date of Patent: Dec. 27, 2016

(54) SEMICONDUCTOR DEVICE AND METHOD OF FABRICATING THE SAME

(71) Applicant: SK hynix Inc., Icheon (KR)

(72) Inventor: Jong Il Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 13 days.

(21) Appl. No.: 14/677,903

(22) Filed: Apr. 2, 2015

(65) Prior Publication Data

US 2015/0214108 A1    Jul. 30, 2015

Related U.S. Application Data

(62) Division of application No. 13/681,355, filed on Nov. 19, 2012, now Pat. No. 9,024,366.

(30) Foreign Application Priority Data

Jul. 12, 2012 (KR) .......................... 10-2012-0076221

(51) Int. Cl.
| | |
|---|---|
| H01L 21/265 | (2006.01) |
| H01L 21/28 | (2006.01) |
| H01L 21/8234 | (2006.01) |
| H01L 21/768 | (2006.01) |
| H01L 29/78 | (2006.01) |
| H01L 21/322 | (2006.01) |
| H01L 21/311 | (2006.01) |
| H01L 27/105 | (2006.01) |
| H01L 23/48 | (2006.01) |

(52) U.S. Cl.
CPC ... *H01L 21/76898* (2013.01); *H01L 21/26513* (2013.01); *H01L 21/28044* (2013.01); *H01L 21/31111* (2013.01); *H01L 21/3221* (2013.01); *H01L 21/823418* (2013.01); *H01L 21/823493* (2013.01); *H01L 27/1052* (2013.01); *H01L 29/78* (2013.01); *H01L 23/481* (2013.01); *H01L 2924/0002* (2013.01)

(58) Field of Classification Search
CPC . H01L 29/78; H01L 2924/0002; H01L 23/481
USPC .................................................. 257/295–324
See application file for complete search history.

(56) References Cited

U.S. PATENT DOCUMENTS

| | | | | |
|---|---|---|---|---|
| 6,828,635 | B2 * | 12/2004 | Panday | ............... H01L 21/8249 |
| | | | | 257/370 |
| 7,041,545 | B2 * | 5/2006 | Willer | ............... H01L 21/28282 |
| | | | | 438/200 |
| 8,681,556 | B2 * | 3/2014 | Kutsukake | ...... H01L 21/823481 |
| | | | | 365/185.05 |
| 2009/0315139 | A1 | 12/2009 | Igeta et al. | |

(Continued)

FOREIGN PATENT DOCUMENTS

| | | |
|---|---|---|
| KR | 10-2009-0087145 A | 8/2009 |
| KR | 10-2011-0076242 A | 7/2011 |
| TW | 201037806 A1 | 10/2010 |

*Primary Examiner* — Cuong Q Nguyen

(57) ABSTRACT

A semiconductor device having a dummy active region for metal ion gathering, which is capable of preventing device failure due to metal ion contamination, and a method of fabricating the same are provided. The semiconductor device includes active regions defined by an isolation layer in a semiconductor substrate and ion-implanted with an impurity, and a dummy active region ion-implanted with an impurity having a concentration higher than that of the impurity in the active region and configured to gather metal ions.

11 Claims, 5 Drawing Sheets

(56) References Cited

U.S. PATENT DOCUMENTS

| | | | |
|---|---|---|---|
| 2010/0052060 A1* | 3/2010 | Lai | .................... H01L 21/31053 |
| | | | 257/368 |
| 2010/0252934 A1 | 10/2010 | Law et al. | |
| 2012/0074515 A1* | 3/2012 | Chen | ..................... H01L 23/585 |
| | | | 257/491 |
| 2013/0316530 A1 | 11/2013 | Law et al. | |
| 2014/0264941 A1 | 9/2014 | Law et al. | |
| 2015/0357240 A1 | 12/2015 | Law et al. | |

* cited by examiner

SEMICONDUCTOR DEVICE AND METHOD OF FABRICATING THE SAME

CROSS-REFERENCES TO RELATED APPLICATION

This application is a divisional of U.S. patent application Ser. No. 13/681,355 filed on Nov. 19, 2012, which claims priority under 35 U.S.C. 119(a) to Korean application number 10-2012-0076221, filed on Jul. 12, 2012, in the Korean Patent Office, the disclosures of which are hereby incorporated by reference in their entirety.

BACKGROUND OF THE INVENTION

The present invention relates to a semiconductor device and a method of fabricating the same, and more particularly, to technology for preventing device failure due to metal ion contamination by forming a dummy active region for gathering of metal ions.

Three-dimensional (3D) stacking technology in package technology of semiconductor integrated circuits has been developed to reduce dimensions of electronic devices, increase packing density of the electronic devices, and improve performance of the electronic devices. The 3D stacked package is a package in which chips having the same storage capacities are stacked and conventionally referred to as a stack chip package.

Stack chip package technology has an advantage of reduced fabrication cost due to a simplified process and mass production. However, stack chip package technology has the disadvantage of a lack of space for electrical connections inside the package due to an increase in the number of stacked chips and a chip size.

That is, the existing stack chip package is fabricated to have a structure in which bonding pads of each chip and conductive circuit patterns of a substrate are electrically connected through wires in a state in which a plurality of chips are attached in a chip attachment region of the substrate. Therefore, a space for wire bonding and an area for the circuit patterns connected to the wires are necessary and thus the dimension of the semiconductor package becomes increased.

To overcome the above-described drawbacks, a structure using a through silicon via (TSV) has been implemented. In an exemplary package, TSVs are formed in each of the stacked chips at a wafer level, and then the chips are stacked on top of one another and physically and electrically connected through vertical TSVs.

However, the TSVs are exposed to heat in subsequent processes such as an annealing process, as well as mechanical stress. When chips are stacked, a bonding process may expose lower surfaces of a semiconductor to, for example, copper ions. Ions may then migrate through the semiconductor to gather in active regions. The gathered metal material acts as a minority carrier generation and recombination center, which causes a leakage current, thereby degrading electrical characteristics of the semiconductor package.

SUMMARY

One or more exemplary embodiments are provided for a semiconductor device having a dummy active region for metal ion gathering and a method of fabricating the same.

According to one aspect of an exemplary embodiment, a semiconductor device is provided. The semiconductor device may include: a plurality of active regions defined by an isolation layer in a semiconductor substrate and implanted with a first concentration of impurity ions; and a dummy active region implanted with a second concentration of impurity ions higher than the first concentration of impurity ions and configured to gather metal ions.

The concentration of the impurity ion-implanted in the dummy active region is at least 1.2 times higher than an impurity concentration in the active regions. The impurity ions in the dummy active region includes a p type impurity or an N type impurity. The impurity ions in the dummy active region are P type ions when the metal ions are positive ions, while the impurity ions in the dummy active region are N type ions when the metal ions are negative ions.

The P type impurity includes boron (B) and the N type impurity includes phosphorous (P) or arsenic (As). The semiconductor device may further include a through silicon via (TSV) formed on a second side of the dummy active region opposite to the first side, wherein the TSV includes the metal ions.

The dummy active region neighbors an active region in a peripheral circuit area.

The semiconductor device may further include: a bit line contact arranged on a first active region; a first gate arranged on a second active region; and a second gate arranged on the dummy active region.

The active regions are formed at first and second sides of the dummy active region. An active region formed on the first side of the dummy active region is implanted with N type impurity ions and an active region formed on the second side of the dummy active region is implanted with P type impurity ions.

The active region formed on the first side of the dummy active region includes an N+ junction region, and the active region formed on the second side of the dummy active region includes a P+ type region.

According to another aspect of an exemplary embodiment, there is provided a method of fabricating a semiconductor device. The method may include: forming a first active region and a plurality of second active regions defined by an isolation layer in a semiconductor substrate; implanting a first concentration of impurity ions into the first active region; and implanting a second concentration of impurity ions into the plurality of second active regions.

The ion-implanting an impurity into the plurality of second active regions may include: implanting N type impurity ions into a first active region of the plurality of second active regions to form a N type well; and implanting P type impurity ions into a second active region of the plurality of second active regions to form a P type well.

The method may further include implanting N type impurity ions in the N type well to form an N+ type junction region; and implanting P type impurity ions into the P type well to form a P+ type junction region.

The ion-implanting an impurity into the first active region includes implanting an N type impurity or a P type impurity into the first active region. The P type impurity may include boron (B) and the N type impurity may include phosphorous (P) or arsenic (As).

The method may further include sequentially stacking a polysilicon layer, a conductive layer, a hard mask layer on at least one of the isolation layer, the first active region, and the plurality of second active regions and patterning the layers to form a gate structure.

The method may further include depositing an interlayer insulating layer on the semiconductor substrate including the gate structure; etching the interlayer insulating layer on any one of the plurality of second active regions to form a bit line contact hole; and depositing a conductive material in the bit line contact hole.

The method may further include forming a through silicon via (TSV) around the first active region or the plurality of second active regions. A P type impurity ions are implanted in the first active region. The first concentration is at least 1.2 times greater than the second concentration. According to another aspect of an exemplary embodiment, there is provided a semiconductor device. The semiconductor device may include: a semiconductor substrate including an active region and a dummy active region; and a TSV penetrating the semiconductor substrate. The active region may include a first P type doping region and the dummy active region may include a second P type doping region. The second doping region may have a doping concentration higher than a doping concentration of the first P type doping region.

The first doping region and the second doping region may includes boron (B)-doped regions.

The semiconductor substrate may further include an isolation layer arranged between the active region and the dummy active region.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1:
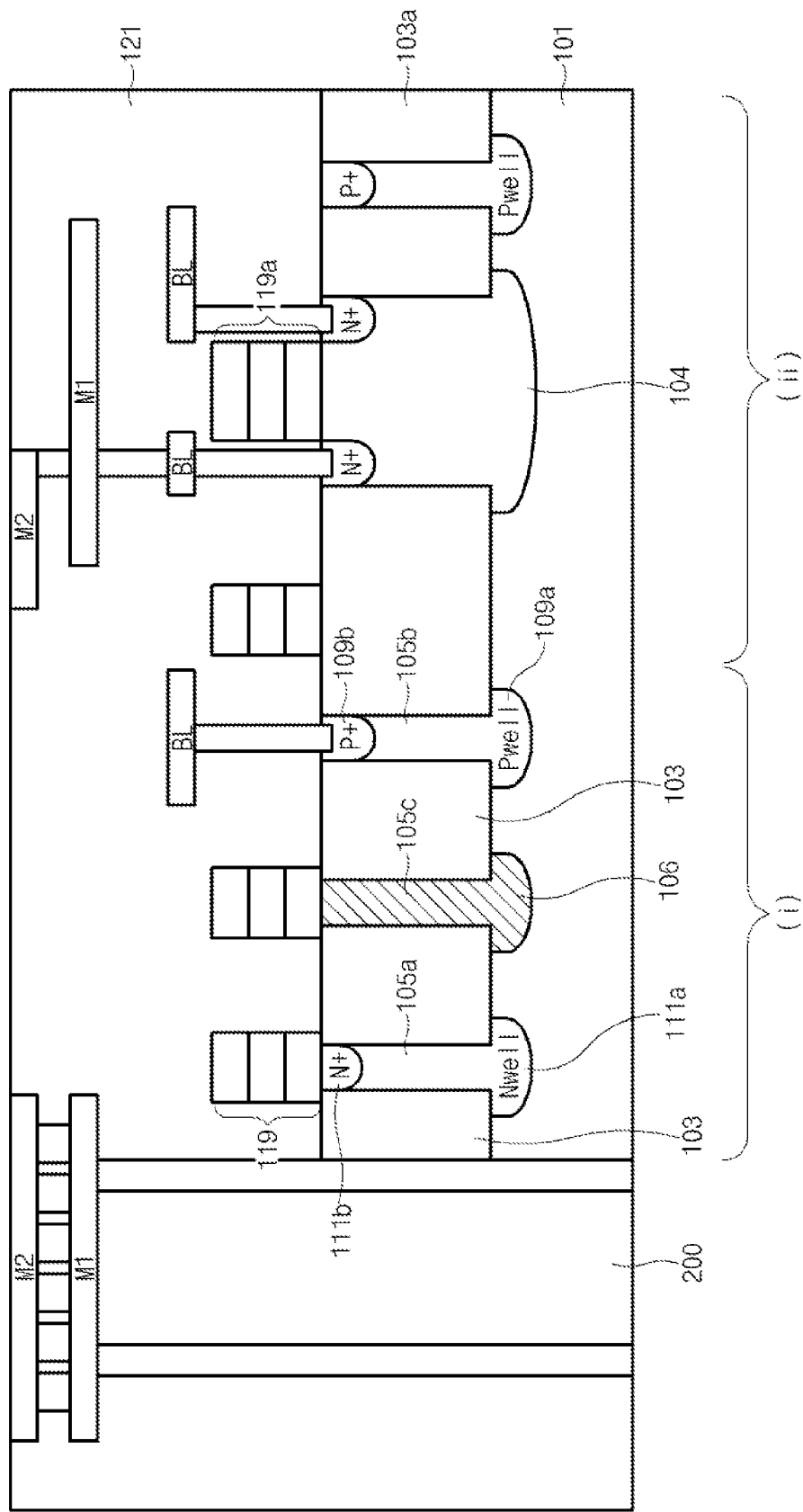
FIG. 1 is a cross-sectional view illustrating a semiconductor device according to an exemplary embodiment of the present invention.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Hereinafter, a semiconductor device and a method of fabricating the same according to exemplary embodiments will be described in detail with reference to FIGS. 1 to 2G.

FIG. 1 is a cross-sectional view illustrating a semiconductor device according to an exemplary embodiment.

A semiconductor device according to an exemplary embodiment includes a peripheral circuit area (i) and a cell area (ii). In the cell area (ii), a gate 119a is formed on an active region 104 defined by an isolation layer 103a in a semiconductor substrate 101, and N type impurity ions are implanted into a P type well serving as the active region 104 to form N+ type impurity implantation regions. Bit line contacts are formed on the N+ type impurity implantation regions and a bit line BL and metal lines M1 and M2 are formed to be connected to the N+ type impurity implantation regions through the bit line contacts.

In the peripheral circuit area (i), an active region 105a implanted with N type impurity ions, an active region 105b implanted with P type impurity ions, and a dummy active region 105c implanted with P type impurity ions, which are defined by the isolation layer 103, are formed in the semiconductor substrate 101. In an embodiment, the active region 105b and the dummy active region 105c are formed so that a concentration of the impurity ions implanted in the dummy active region 105c is higher than that of the impurity ions implanted into the active regions 105b and 105a.

In embodiments, the concentration of P type impurity ions implanted into the active region 105b is $3.0 \times 10^{15}/cm^2$ to $5.0 \times 10^{16}/cm^2$. The particular type and concentration of ions in active regions may vary between embodiments, depending on, for example, the type of semiconductor and area of the semiconductor. The present invention is not limited by the particular type and concentration of impurity ions in the active regions. The concentration of the P type impurity ions implanted into the dummy active region 105c is between 1.2 and 100 times higher than the concentration of the P type impurity ions implanted into active region 105b.

A through silicon via (TSV) 200 for formation of a stack chip package is formed at a side of the peripheral circuit area (i). The exemplary embodiment illustrated in FIG. 1 shows the TSV 200 formed at the side of the peripheral circuit area (i), but in other embodiments the TSV 200 may be formed in any portion of a silicon substrate. In various embodiments, TSVs are disposed at regular intervals in a semiconductor to evenly distribute the transfer of electricity between chips in a stack.

As discussed above, dummy active region 105c is doped to have a higher concentration of impurity ions than neighboring active region 105b, and may be doped with ions of the same type. Therefore, when copper ion contaminants migrate from TSV 200, the copper ions are attracted to and gathered in the dummy active region 105c, thereby preventing a failure at the bit line contact.

The principle of gathering copper ions in the dummy active region 105c will now be described in greater detail.

Silicon (Si) in the semiconductor substrate 101 is a group IV element and has four valence electrons in the outer valence shell out of a possible eight. Thus, in a silicon-silicon (Si—Si) bond, each silicon (Si) atom has total of four covalent bonds, where each atom shares four electrons in its outer valence shell with the four atoms in the valence shell of the other atom. However, boron (B), which is a group III element, has three valence electrons. In a silicon-boron (Si—B) bond, one boron (B) atom forms a total of three covalent bonds for a valence of three. The remaining one bond does not form a covalent bond, and thus boron (B) is unilaterally provided with one valence electron from silicon (Si). In other words, the boron ions create holes in a silicon matrix. Thus, boron atoms (B) in the p type well have a negative ion ($B^-$) state.

When positive copper ions ($Cu^{++}$) are introduced into a substrate which includes negatively charged boron ions, the positive copper ions may be attracted to the negative boron ions. If the difference in charges is great enough and the proximity is close enough, the positively charged copper ions ($Cu^{++}$) migrate to the negatively charged boron ions ($\beta^-$).

In an embodiment, the distance between the TSV and the dummy active region is determined based on the charge of the contaminant and the concentration of impurities in the dummy active region 105c. The distance should be sufficient for the charges of the contaminant and the dummy active region to interact. In other embodiments, if a distance to contaminants is not precisely known, dummy active regions may be disposed near active regions that may otherwise have a significant risk of attracting contaminants. When the difference between the impurity concentration of the dummy active region 105c and an active region 105b is greater, the dummy active region 105c may be disposed further from active region 105b, while if the difference between impurity concentrations is smaller, they may be disposed closer together. In an embodiment, the concentration difference and proximity of active region 105b and dummy active region 105c are determined so that a contaminant is attracted to the dummy active region 105c instead of the active region 105b. The metal ions are trapped in the polysilicon layer doped with impurities through the above-described principle.

The embodiment of FIG. 1 has been described as having a dummy active region 105c implanted with P type impurities, and gathering copper ions. However, in other embodiments, when positive metal ions other than the copper ions are gathered, dummy active region 105c may be doped with N type impurities. That is, in various embodiments, different kinds of impurities may be implanted into the dummy active regions depending on the type of metal ions to be gathered.

FIGS. 2A to 2G are enlarged cross-sectional views of the peripheral circuit area (i) of FIG. 1 illustrating a method of fabricating a semiconductor device according to an exemplary embodiment.

Figure 2A:
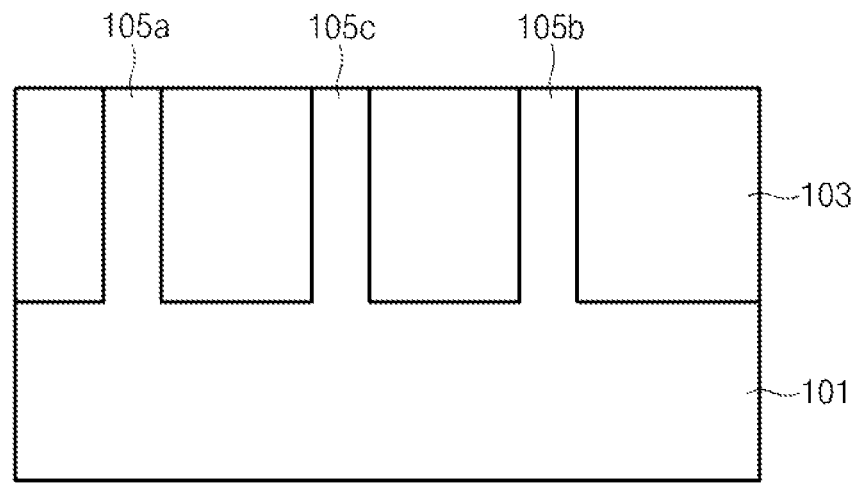
FIGS. 2A to 2G are cross-sectional views illustrating a method of fabricating a semiconductor device according to an exemplary embodiment of the present invention.

As shown in FIG. 2A, in a peripheral circuit area (i), active regions 105a and 105b and a dummy active region 105c are defined by an isolation layer 103 in a semiconductor substrate 101. In an embodiment, the dummy active region 105c may be formed between the active regions 105a and 105b.

Figure 2B:
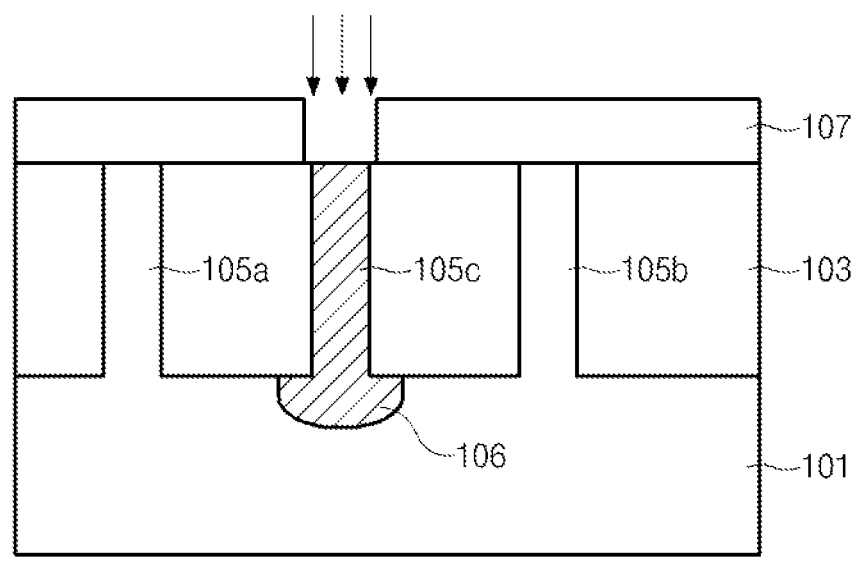

As shown in FIG. 2B, a photoresist pattern 107 is formed on the active regions 105a and 105b and the isolation layer 103 to expose the dummy active region 105c. P type impurities are deposited through ion implantation into the exposed dummy active region 105c to form a P type well 106. In various embodiments, the concentration of impurities in the dummy active region 105c may be 1.2 to 100 times higher than the concentration of impurities in active region 105b that are implanted in a subsequent process.

Figure 2C:
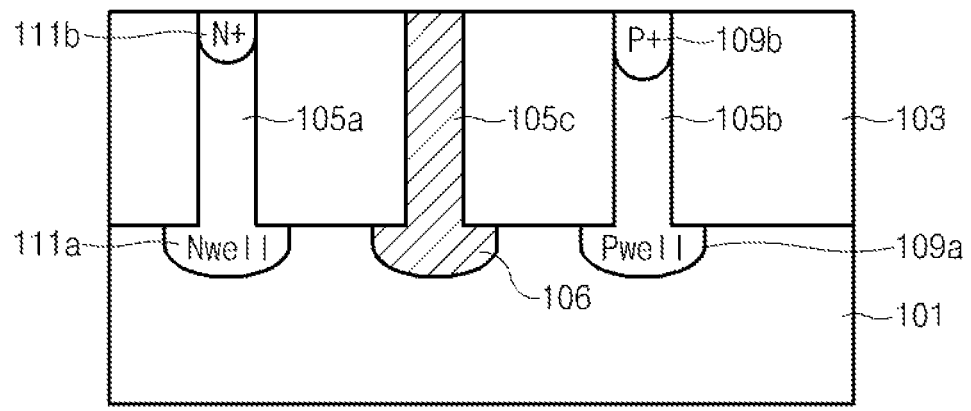

As shown in FIG. 2C, the photoresist pattern 107 is subsequently removed. N type impurities are then implanted by ion implantation into active region 105a, and P type impurities are implanted into active region 105b.

Specifically, a photoresist layer (not shown) is formed on the active region 105b, the dummy active region 105c, and the isolation layer 103 to expose only the active region 105a. N type impurities are implanted into active region 105a to form a N type well 111a, and then N type impurities are further implanted into an upper portion of the N type well 111a to form N+ type ion implantation region (N+ type junction region) 111b, and the photoresist layer is removed. In an embodiment, the N type impurity includes phosphorous (P) or arsenic (As).

Subsequently, a photoresist layer (not shown) is formed on the active region 105a, the dummy active region 105c and the isolation layer 103 to expose only the active region 105b. P type impurities are implanted into the active region 105b to form a P type well 109a, and then P type impurities are further implanted into an upper portion of the P type well 109a to form a P+ type ion implantation region (P+ type junction region) 109b. In an embodiment, the processes of ion-implanting the impurities into the active region 105a and 105b may be performed in a reverse order. The present invention is not limited by a particular order of implanting ions into active regions 105a and 105b or the dummy active region 105c.

Figure 2D:
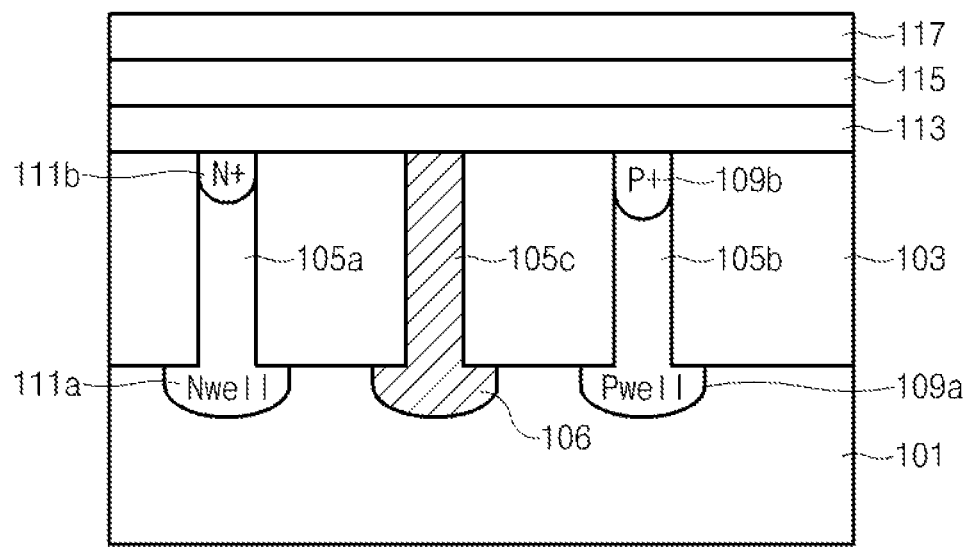

According to FIG. 2D, a gate oxide layer (not shown) is formed on the active regions 105a and 105b, the dummy active region 105c, and the isolation layer 103. A polysilicon layer 113, a conductive layer 115, and a hard mask layer 117 for gate formation are sequentially stacked on the gate oxide layer. In an embodiment, the polysilicon layer 113 may be formed of polysilicon material. The conductive layer 115 may be formed of a conductive material such as tungsten (W), titanium (Ti), nickel (Ni), aluminum (Al), or copper (Cu). The hard mask material 117 may be formed of a nitride material such as a silicon nitride layer $Si_3N_4$.

Figure 2E:
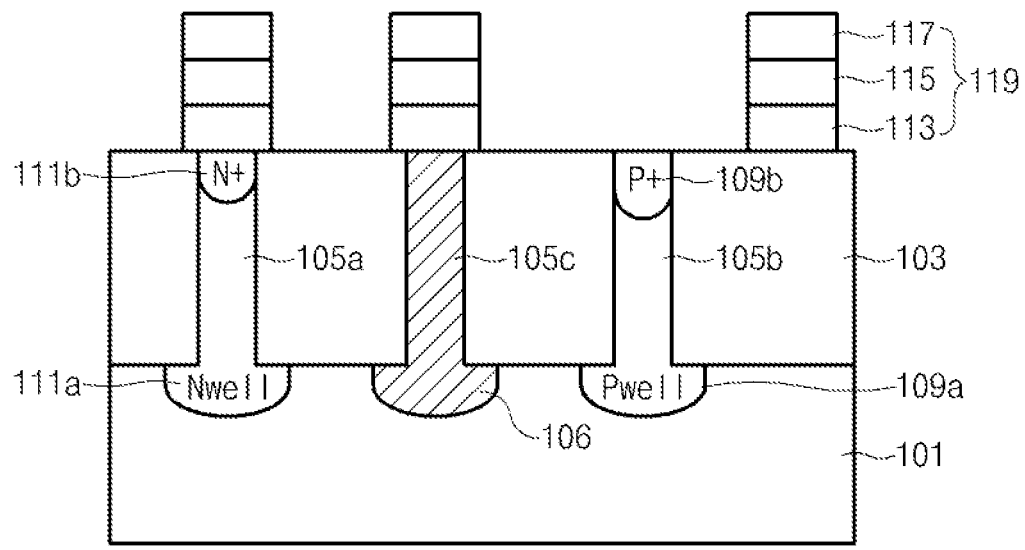

As shown in FIG. 2E, the polysilicon layer 113, the conductive layer 115, and the hard mask layer 117 are etched using a photoresist layer (not shown) as an etch mask to form a gate structure 119. As seen in the figure, a gate may be disposed over active region 105a, and a gate may also be disposed over dummy active region 105c. In an embodiment, no electricity flows through the gate over the active region 105c.

Figure 2F:
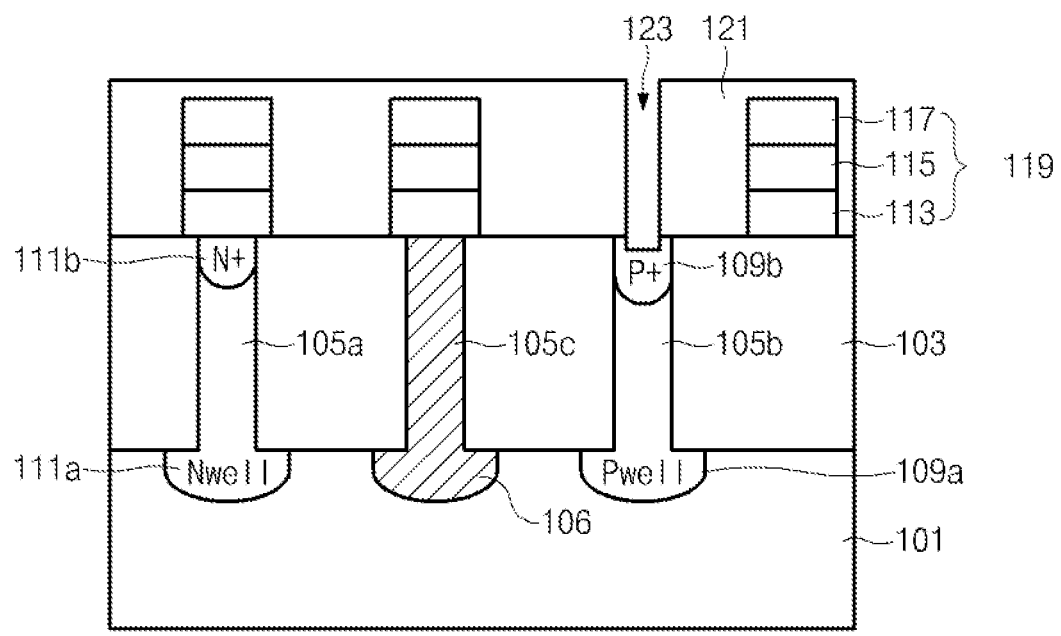

As shown in FIG. 2F, an interlayer insulating layer 121 is formed on a surface of the semiconductor substrate including the gate structure 119 and then planarized through a chemical mechanical polishing (CMP) process. The interlayer insulating layer 121 is subsequently etched to expose a portion of the P+ ion implantation region 109b, resulting in a bit line contact hole 123 disposed above the ion implantation region 109b. In various embodiments, the interlayer insulating layer 121 may include silicon oxide ($SiO_2$), boron phosphorus silicate glass (BPSG), phosphorus silicate glass (PSG), tetra ethyl ortho silicate (TEOS), undoped silicate glass (USG), spin on glass (SOG), high density plasma (HDP) oxide, or spin on dielectric (SOD).

Figure 2G:
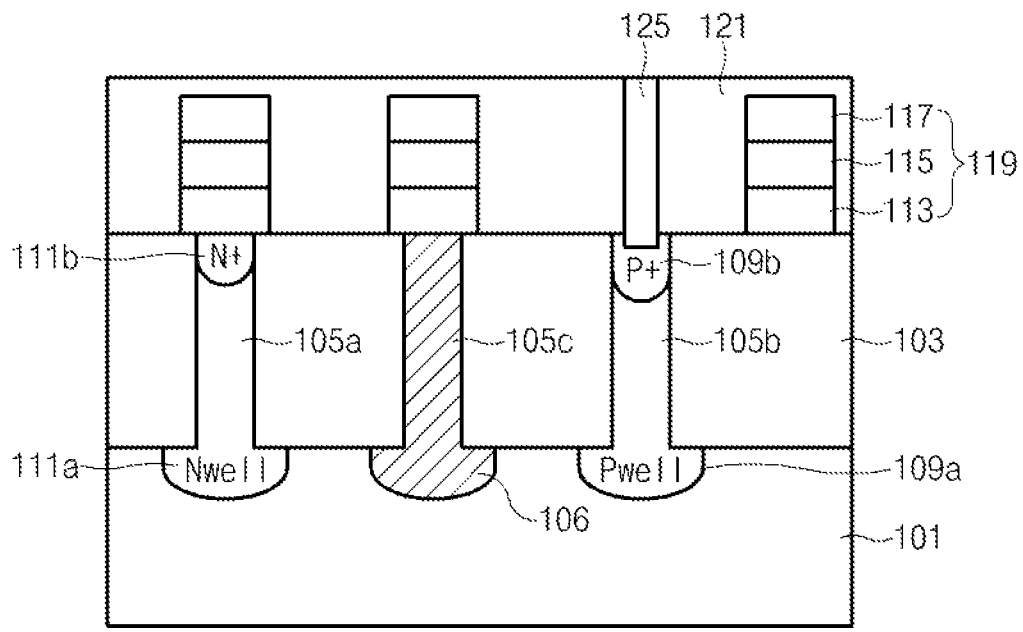

As shown in FIG. 2G, a conductive material is deposited to fill the bit line contact hole 123 of FIG. 2F, thereby forming bit line contact 125.

According to an exemplary method of fabricating a semiconductor device, a dummy active region 105c comprising a higher concentration of impurity ions than an active region of the cell area is formed in the peripheral circuit area. The contaminated metal ions such as copper are attracted into the dummy active region so that an adverse effect on the active region by the contaminated metal ions such as copper can be prevented.

Although exemplary embodiments have been explained with respect to removing copper ion contamination resulting from TSVs, other embodiments may use dummy active regions to attract other types of contaminant ions originating from other sources. Further, various types of impurities (a P type impurity or an N type impurity) may be implanted into the dummy active region according to the particular kind of contaminant. For example, when the contamination is a positive metal ion, a P type impurity is implanted into the dummy active region 105c to form the P well. When the contaminated metal ion is a negative ion, an N type impurity is implanted into the dummy active region 105c to form the N well.

The above description provides a structure and method for making a semiconductor that may have one or more of the following advantages.

First, metal ions contaminants in a semiconductor device are gathered by the dummy active region, preventing device failure that would otherwise occur.

Second, copper ion contaminants introduced from TSVs are gathered by the dummy active region.

While certain embodiments have been described above, the embodiments only examples of ways in which the present invention may be embodied. Accordingly, the devices and methods described herein are not limited based on the described embodiments. Rather, the systems and methods described herein should only be limited in light of the claims that follow when taken in conjunction with the above description and accompanying drawings.

What is claimed is:

1. A method of fabricating a semiconductor device, the method comprising:
   forming a dummy active region, a first active region, and a second active region defined by an isolation layer in a semiconductor substrate, wherein the dummy active region is disposed between the first active region and the second active region;
   implanting a first type of impurity ions into the dummy active region; and
   implanting a second type of impurity ions into the first active region and the first type of impurity ions into the second active region,
   wherein a concentration of impurity ions of the dummy active region is higher than a concentration of impurity ions of the second active region.

2. The method of claim 1, wherein implanting impurity ions into the first and second active regions includes:
   implanting N type impurity ions into the first active region to form a N type well; and
   implanting P type impurity ions into the second active region to form a P type well.

3. The method of claim 2, further comprising:
   implanting N type impurity ions in the N type well to form an N+ type junction region; and
   implanting P type impurity ions into the P type well to form a P+ type junction region.

4. The method of claim 1, wherein implanting the impurity ions into the dummy active region includes implanting an N type impurity or a P type impurity into the dummy active region.

5. The semiconductor device of claim 1, wherein the dummy active region is formed in a peripheral region.

6. The method of claim 1, further comprising sequentially stacking a polysilicon layer, a conductive layer, a hard mask layer on at least one of the isolation layer, the dummy active region, the first active region, and the second active region and patterning the layers to form a gate structure.

7. The method of claim 6, further comprising:
   depositing an interlayer insulating layer on the semiconductor substrate including the gate structure;
   etching the interlayer insulating layer on any one of the first and second active regions to form a bit line contact hole; and
   depositing a conductive material in the bit line contact hole.

8. The method of claim 1, further comprising forming a through silicon via (TSV) around the dummy active region, the first active region, or the second active region.

9. The method of claim 8, wherein P type impurity ions are implanted in the dummy active region.

10. The method of claim 1, wherein the first concentration is at least 1.2 times greater than the second concentration.

11. The method of claim 8, wherein the dummy active region is formed between the through silicon via (TSV) and the second active region.

* * * * *